United States Patent
Nagano et al.

(10) Patent No.: US 6,758,920 B2
(45) Date of Patent: Jul. 6, 2004

(54) CONDUCTIVE INTEGRATED CIRCUIT METAL ALLOY INTERCONNECTIONS, ELECTROPLATING ANODES; METAL ALLOYS FOR USE AS A CONDUCTIVE INTERCONNECTION IN AN INTEGRATED CIRCUIT; AND PHYSICAL VAPOR DEPOSITION TARGETS

(75) Inventors: Shozo Nagano, Kanagawa (JP); Hinrich Hargarter, IJmuiden (NL); Jianxing Li, Spokane, WA (US); Jane Buehler, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 79 days.

(21) Appl. No.: 09/784,234

(22) Filed: Feb. 14, 2001

(65) Prior Publication Data

US 2001/0035237 A1 Nov. 1, 2001

Related U.S. Application Data

(62) Division of application No. 09/449,025, filed on Nov. 24, 1999, now abandoned.

(51) Int. Cl.[7] .................................................. C22C 9/00
(52) U.S. Cl. ........................ 148/432; 420/469; 420/500
(58) Field of Search ................................ 148/432, 314; 420/469, 500

(56) References Cited

U.S. PATENT DOCUMENTS

| | | | |
|---|---|---|---|
| 3,666,686 A | 5/1972 | Haertling | 252/62.9 |
| 3,766,642 A | 10/1973 | Schlaudt et al. | |
| 3,923,675 A | 12/1975 | Mazdlyasni et al. | 252/62.9 |
| 3,963,934 A | 6/1976 | Ormrod | 250/499 |

(List continued on next page.)

FOREIGN PATENT DOCUMENTS

| | | |
|---|---|---|
| CN | 85104006 | 1/1986 |
| EP | 0 335 383 A2 | 3/1989 |
| EP | 0441408 A2 | 8/1991 |

(List continued on next page.)

OTHER PUBLICATIONS

Yeon et al., "Electrical Characteristics of the MOD–derived SrBi2xTa2O9 and SrBi2.4(TA,Nb)2O9 Thin Films", Journal of Materials Science, 35(10), pp. 2405–2411, May 15, 2000. Abstract only.

(List continued on next page.)

*Primary Examiner*—Sikyin Ip
(74) *Attorney, Agent, or Firm*—Wells St. John P.S.

(57) ABSTRACT

A physical vapor deposition target includes an alloy of copper and silver, with the silver being present in the alloy at from less than 1.0 at % to 0.001 at %. In one implementation, a physical vapor deposition target includes an alloy of copper and silver, with the silver being present in the alloy at from 50 at % to 70 at %. A physical vapor deposition target includes an alloy of copper and tin, with tin being present in the alloy at from less than 1.0 at % to 0.001 at %. In one implementation, a conductive integrated circuit metal alloy interconnection includes an alloy of copper and silver, with the silver being present in the alloy at from less than 1.0 at % to 0.001 at %. A conductive integrated circuit metal alloy interconnection includes an alloy of copper and silver, with the silver being present in the alloy at from 50 at % to 70 at %. A conductive integrated circuit metal alloy interconnection includes an alloy of copper and tin, with tin being present in the alloy at from less than 1.0 at % to 0.001 at %. Other useable copper alloys include an alloy of copper and one or more other elements, the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, Te, V, Nb, Ta, Cr, Mo, W, Mn, Tc, Re, Fe, Ru, Os, Co, Rh, Ni, Pd, Pt, Au, Tl, and Pb. An electroplating anode is formed to comprise one or more of the above alloys.

12 Claims, 2 Drawing Sheets

U.S. PATENT DOCUMENTS

| | | | |
|---|---|---|---|
| 4,132,614 A | 1/1979 | Cuomo et al. | 204/192 EC |
| 4,149,907 A | 4/1979 | Wronski et al. | 148/1.5 |
| 4,159,909 A | 7/1979 | Wilson | 75/170 |
| 4,189,084 A | 2/1980 | Johnson et al. | |
| 4,198,283 A | 4/1980 | Class et al. | 204/298 |
| 4,209,375 A | 6/1980 | Gates et al. | 204/192 R |
| 4,311,522 A | 1/1982 | Batra et al. | |
| 4,385,979 A | 5/1983 | Pierce et al. | 204/298 |
| 4,545,882 A | 10/1985 | McKelvey | 204/192 R |
| 4,629,859 A | 12/1986 | Reddy | 219/121 LM |
| 4,676,827 A | 6/1987 | Hosoda et al. | |
| 4,786,469 A * | 11/1988 | Weber et al. | 420/469 |
| 4,814,053 A | 3/1989 | Shimokawato | 204/192.15 |
| 4,986,856 A | 1/1991 | Tanigawa et al. | |
| 5,023,698 A | 6/1991 | Kobayashi et al. | 357/67 |
| 5,066,617 A | 11/1991 | Tanemoto et al. | 501/134 |
| 5,077,005 A | 12/1991 | Kato | |
| 5,171,411 A | 12/1992 | Hillendahl et al. | 204/192.12 |
| 5,215,639 A | 6/1993 | Boys | 204/192.12 |
| 5,242,566 A | 9/1993 | Parker | 204/298.2 |
| 5,268,236 A | 12/1993 | Dumont et al. | 428/636 |
| 5,282,943 A | 2/1994 | Lannutti et al. | 204/192.12 |
| 5,282,946 A | 2/1994 | Kinoshita et al. | 204/298.13 |
| 5,312,790 A | 5/1994 | Sengupta et al. | 522/127 |
| 5,314,651 A | 5/1994 | Kulwicki | 264/65 |
| 5,336,386 A | 8/1994 | Marx et al. | 204/298.12 |
| 5,397,050 A | 3/1995 | Mueller | 228/193 |
| 5,435,826 A | 7/1995 | Sakakibara et al. | 75/232 |
| 5,486,491 A | 1/1996 | Sengupta et al. | 501/137 |
| 5,490,914 A | 2/1996 | Hurwitt et al. | 204/289.12 |
| 5,589,040 A | 12/1996 | Nishimura | 204/192.26 |
| 5,590,389 A * | 12/1996 | Dunlop et al. | 419/67 |
| 5,674,367 A | 10/1997 | Hunt et al. | 204/298.12 |
| 5,693,203 A | 12/1997 | Ohhashi et al. | 240/298.12 |
| 5,719,447 A | 2/1998 | Gardner | |
| 5,772,858 A | 6/1998 | Tepman | 204/192.12 |
| 5,833,820 A | 11/1998 | Dubin | 204/212 |
| 5,833,823 A | 11/1998 | Gruenenfelder et al. | 204/298.09 |
| 5,846,389 A | 12/1998 | Levine et al. | 204/192.1 |
| 5,895,562 A | 4/1999 | Dubin | 205/137 |
| 5,972,192 A | 10/1999 | Dubin et al. | |
| 6,010,583 A | 1/2000 | Annavarapu et al. | 148/513 |
| 6,028,003 A | 2/2000 | Frisa et al. | 438/653 |
| 6,039,855 A | 3/2000 | Wollenberg | 204/298.12 |
| 6,042,752 A | 3/2000 | Mitsui | 252/520.1 |
| 6,068,742 A | 5/2000 | Daxinger et al. | 204/298.09 |
| 6,086,735 A | 7/2000 | Gilman et al. | 204/298.12 |
| 6,093,966 A | 7/2000 | Venkatraman et al. | 257/751 |
| 6,113,761 A | 9/2000 | Kardokus et al. | 204/298.13 |
| 6,117,281 A | 9/2000 | Novbakhtian | 204/192.16 |
| 6,117,781 A | 9/2000 | Lukanc et al. | |
| 6,117,782 A | 9/2000 | Lukanc et al. | |
| 6,121,150 A | 9/2000 | Avanzino et al. | |
| 6,121,685 A | 9/2000 | Gardner | 257/762 |
| 6,139,701 A | 10/2000 | Pavate et al. | 204/192.17 |
| 6,162,726 A | 12/2000 | Dubin | 438/678 |
| 6,197,433 B1 | 3/2001 | Hatano | |
| 6,238,494 B1 | 5/2001 | Segal | |
| 6,277,254 B1 | 8/2001 | Tan et al. | |
| 6,440,243 B1 | 8/2002 | Tan et al. | |
| 6,451,222 B1 | 9/2002 | Li et al. | |
| 6,478,902 B2 | 11/2002 | Koenigsmann et al. | 148/681 |
| 6,579,467 B2 | 6/2003 | Li et al. | |

FOREIGN PATENT DOCUMENTS

| | | |
|---|---|---|
| EP | 0 626 722 A1 | 2/1993 |
| EP | 0 882 813 A1 | 12/1998 |
| EP | 1026284 A1 | 9/2000 |
| JP | 49007777 | 2/1974 |
| JP | 61084389 A2 | 4/1986 |
| JP | 61113740 A2 | 5/1986 |
| JP | 61227972 | 10/1986 |
| JP | 62116743 | 5/1987 |
| JP | 62127438 | 6/1987 |
| JP | 62036798 | 8/1987 |
| JP | 09249957 A | 9/1987 |
| JP | 63033174 | 2/1988 |
| JP | 63064211 | 3/1988 |
| JP | 63118033 | 5/1988 |
| JP | 63235442 A2 | 9/1988 |
| JP | 1-96374 | 4/1989 |
| JP | 1-96376 | 4/1989 |
| JP | 01096376 A | 4/1989 |
| JP | 02301585 | 12/1990 |
| JP | 05078195 A2 | 3/1993 |
| JP | 06081138 | 1/1994 |
| JP | 10287939 | 10/1998 |
| JP | 113233539 | 11/1999 |
| JP | 2000239836 A | 9/2000 |
| WO | WO 00/73531 A2 | 7/2000 |

OTHER PUBLICATIONS

Yan et al., "Preparation on the [(Pb,La) (Zr,Ti)03] Ferroelectric Thin Films by Using the Sol–Gel Processing", Piezoelectrics and Acoustooptics, vol. 17, Issue n 5, Oct. 1995, pp. 24–27.

Reda et al., "Amorphous copper–silver films with high stability", Int. Cent. Theor. Phys., Trieste, Italy, 1983. (Abstract only) The year is sufficiently early so that the month is not in issue.

U.S. patent application, 09/556,488, Kardokus, filed Apr. 21, 2000.

U.S. patent application, 09/714,714, Kardokus, filed Nov. 15, 2000.

Electromigration Properties of Copper–Zirconium alloy Interconnects, Y. Igarashi et al., *J. Vac. Sci. Technol. B 16(5)*, Sep./Oct. 1998, p. 2745–2750.

Directional and Preferential Sputtering–Based Physical Vapor Depositions, S.M. Rossnagel, *1995 Elsevier Science S.A.*, p. 1–12.

Excellent Electro/Stress–Migration–Resistance Surface–Silicide Passivated Giant–Grain Cu–Mg alloy Interconnect Technology for Giga Scale Integration (GSI), T. Takewaki et al., *1995 IEEE*, p. 95–253–95–256.

Materials Issues in Copper Interconnections, J.M.E. Harper, et al., *MRS Bulletin/Aug.* 1994, p. 23–29.

Preparation of Low Resistivity Cu–1 at. %Cr Thin Films by Magnetron, C. Cabral, Jr., et al., *Journal of the Institute of Metals,* Jun. 1951, p. 185–208.

International Critical Tables of Numerical Data, Physics, Chemistry and Technology, *National Research Council of the United States of Americs,* vol. I–VII, 1933, 6 pages.

Phillips et al., *The Effects of Certain Solute Elements on the Recrystallization of Copper.* 81 Journal of the Institute of Metals 185–208 (1953).

Abstract: Pierson et al., *Total sputtering yield of Ag/Cu alloys for low energy argon ions*, § B Nucl. Instrum. Methods Phys. Res. 108(3), pp. 290–299 (1996).

Foster, *Composition and Structure of Sputtered Films of Ferroelectric Niobates,* § The Journal of Vacuum Science and Technology, No. 1, pp. 251–255 (1971).

Haertling, *Hot–Pressed Ferroelectric Lead Zirconate Titenate Ceramics for Electro–Optical Applications,* 49 Ceramic Bulletin, No. 6, pp. 564–567 (1970).

Dierckxsens et al., *Effect of trace elements on the recrystallization behavior of high purity oxgyen–containing copper,* ERZmetal 28(11), 496–500 (1975). Abstract only.

Lucke et al., *Physical Metalurgy Principles,* 5 Acta Met. 298 (1957).

Pierson et al., *Total sputtering yield of Ag/Cu alloys for low energy argon ions,* Nucl. Instr. and Meth. In Phys. Res. 108 B, pp. 290–299 (1996). Full text of article submitted in abstract earlier.

U.S. patent application Ser. No. 09/556,488, Kardokus et al., filed Apr. 21, 2000.

U.S. patent application Ser. No. 09/615,474, Kardokus et al., filed Jul. 13, 2000.

U.S. patent application Ser. No. 09/714,714, Kardokus, filed Nov. 15, 2000.

Massalski, 18 Binary Alloy Phase Diagrams 18–19, 928–929, 936–937, 964–965 (1986).

Brizzolars et al., *Low Energy Sputtering of Eutectic Ag/Cu Alloys,* B26 Nuclear Instruments and Methods in Physics Research 528–531 (1987).

* cited by examiner

CONDUCTIVE INTEGRATED CIRCUIT METAL ALLOY INTERCONNECTIONS, ELECTROPLATING ANODES; METAL ALLOYS FOR USE AS A CONDUCTIVE INTERCONNECTION IN AN INTEGRATED CIRCUIT; AND PHYSICAL VAPOR DEPOSITION TARGETS

RELATED PATENT DATA

This patent resulted from a divisional application of U.S. Patent Application Ser. No. 09/449,025, filed Nov. 24, 1999, entitled "Physical Vapor Deposition Targets, Conductive Integrated Circuit Metal Alloy Interconnects, Electroplating Anodes, and Metal Alloys For Use as a Conductive Interconnection in an Integrated Circuit", naming Shozo Nagano, Hinrich Hargarter, Jianxing Li and Jane Buehler as inventors, the disclosure of which is incorporated by reference.

TECHNICAL FIELD

This invention relates to physical vapor deposition targets, to conductive integrated circuit metal alloy interconnections, and to electroplating anodes.

BACKGROUND OF THE INVENTION

Aluminum and its alloys are common metal materials used in metal interconnects in the fabrication of integrated circuitry on semiconductor wafers. Yet as circuitry density increases and operating speed increases, aluminum's electrical resistance is expected to prevent its use in many next generation circuits. Copper has been proposed as a strong candidate to replace aluminum and its alloys due to copper's low bulk resistivity of 1.7 microohms.cm at near 100% purity (i.e., greater than 99.999% copper). Further, it has electromigration resistance compared to that of aluminum and its alloys of about 10 times or greater.

One problem associated with pure copper interconnects concerns abnormal grain growth or thermal stability in the deposited film. Further, such abnormal and undesired grain growth can reduce the film's electromigration resistance. Low thermal stability is defined as, and abnormal grain growth is characterized by, a tendency of the individual crystal grains within copper to grow when exposed to a certain temperature. The higher the temperature at which a material recrystallizes or starts to grow larger grains, the higher the thermal stability of the material.

Elemental copper and its alloys can be deposited in integrated circuitry fabrication using a number of techniques, including chemical vapor deposition, physical vapor deposition and electrochemical deposition, such as electroplating. Ideally when deposited, the copper comprising sputtering target will have substantially uniform microstructure, a fine grain size, and preferred crystal orientation in order to achieve desired sputtering performance and resultant thin film formation and properties.

SUMMARY

The invention includes conductive integrated circuit metal alloy interconnections, physical vapor deposition targets and electroplating anodes. In one implementation, a physical vapor deposition target includes an alloy of copper and silver, with the silver being present in the alloy at from less than 1.0 at % to 0.001 at %. In one implementation, a physical vapor deposition target includes an alloy of copper and silver, with the silver being present in the alloy at from 50 at % to 70 at %. In one implementation, a physical vapor deposition target includes an alloy of copper and tin, with tin being present in the alloy at from less than 1.0 at % to 0.001 at %.

In one implementation, a conductive integrated circuit metal alloy interconnection includes an alloy of copper and silver, with the silver being present in the alloy at from less than 1.0 at % to 0.001 at %. In one implementation, a conductive integrated circuit metal alloy interconnection includes an alloy of copper and silver, with the silver being present in the alloy at from 50 at % to 70 at %. In one implementation, a conductive integrated circuit metal alloy interconnection includes an alloy of copper and tin, with tin being present in the alloy at from less than 1.0 at % to 0.001 at %.

In one implementation, an electroplating anode includes an alloy of copper and silver, with the silver being present in the alloy at from less than 1.0 at % to 0.001 at %. In one implementation, an electroplating anode includes an alloy of copper and silver, with the silver being present in the alloy at from 50 at % to 70 at %. In one implementation, an electroplating anode includes an alloy of copper and tin, with tin being present in the alloy at from less than 1.0 at % to 0.001 at %.

In other implementations, other useable copper alloys in physical vapor deposition targets, conductive integrated circuit metal alloy interconnections, and electroplating anodes include an alloy of copper and one or more other elements, the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, Te, V, Nb, Ta, Cr, Mo, W, Mn, Tc, Re, Fe, Ru, Os, Co, Rh, Ni, Pd, Pt, Au, Ti, and Pb. An electroplating anode is formed to comprise one or more of the above alloys.

In other implementations, the invention contemplates metal alloys for use as a conductive interconnection in an integrated circuit.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
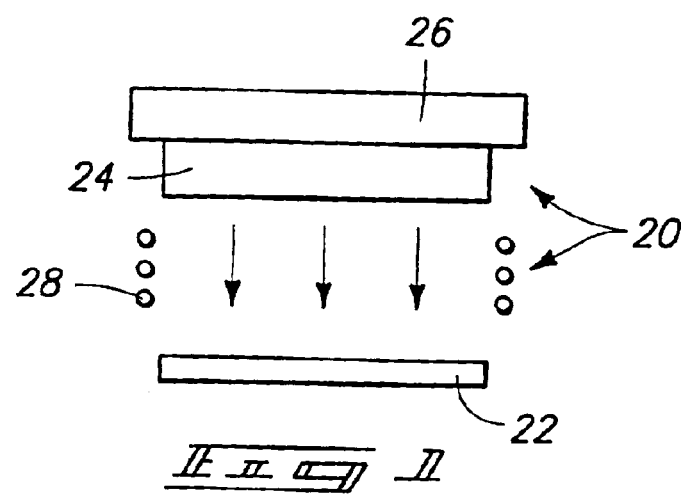
FIG. 1 is a diagrammatic sectional view of a physical vapor deposition target system in accordance with an aspect of the invention.

This disclosure of the invention is submitted in furtherance of the constitutional purposes of the U.S. Patent Laws "to promote the progress of science and useful arts" (Article 1, Section 8).

The present invention includes novel physical vapor deposition targets comprising alloys of copper and silver, and comprising alloys of copper and tin. The invention also contemplates conductive integrated circuit interconnections comprised of such metal alloys, and whether deposited utilizing the inventive physical vapor deposition targets, by chemical vapor deposition or by other methods. The invention includes electroplating anodes comprising alloys of copper and silver, and comprising alloys of copper and tin. The invention also includes physical vapor deposition targets, conductive integrated circuit interconnections, and electroplating anodes comprising other copper alloys. The invention also contemplates metal alloys for use as a conductive interconnection in an integrated circuit, by way of example only as might be used as raw material for producing physical vapor deposition targets or electroplating anodes.

In one implementation, a physical vapor deposition target comprises an alloy of copper and silver, with the silver being present in the alloy at from less than 1.0 at % to 0.001 at %, and more preferably at from 0.005 at % to 0.1 at %. An aspect of the invention also includes a conductive integrated circuit metal alloy interconnection comprising this alloy of copper and silver. Preferably, such interconnection will have higher electromigration resistance than copper of a purity greater than 99.999% of the same grain size. Further preferably, the alloy will have greater thermal stability to grain size retention and crystal orientation retention than copper of a purity of greater than 99.999% of the same grain size. Further preferably, very near the pure copper electrical conductivity is ideally achieved. Preferably when the interconnection is deposited from a sputtering target, the alloy offers very stable sputtering target microstructure and texture. A thermally stabilized target of this alloy can offer improved sputtering performance and resultant thin film properties within the circuitry. Regardless and when deposited from chemical vapor deposition or other methods, the alloy offers higher electromigration resistance while maintaining very near the pure copper electrical conductivity. Silver can form uniformly fine precipitates in the microstructure in the form of elemental precipitates.

In another aspect of the invention, the physical vapor deposition target comprises an alloy of copper and silver, with silver being present in the alloy at from 50 at % to 70 at %, more preferably at between 55 at % and 65 at %, and most preferably at about 60 at %. The invention also contemplates a conductive integrated circuit metal alloy interconnection comprising this alloy of copper and silver, whether deposited by physical vapor deposition, chemical vapor deposition or other methods. Most preferably, the resultant alloy as formed in the circuit has higher electromigration resistance than copper of a purity of greater than 99.999% of the same grain size. Further preferably, the alloy interconnection preferably has greater thermal stability to grain size retention and crystal orientation retention than copper of a purity of greater than 99.999% of the same grain size.

Silver is a very desirable doping element in copper for physical vapor deposition targets and conductive integrated circuity metal alloy interconnections, as it has a similar electrical resistivity with copper and forms essentially no solid solution with copper. Accordingly, a copper-silver alloy can be largely represented as a mechanical mixture of silver grains and copper grains. Due to this structure and mixture, a copper-silver alloy has minimum electrical resistivity increase over that of pure copper even at high-level silver concentrations. Further, it is reported that the lowest electrical resistivity of copper-silver alloys is close to the eutectic composition, which is at about copper at 40 at %, silver at 60 at %, and is only about 10% above the resistivity of pure copper. Accordingly, a considerably reduced or lower reflow temperature can be achieved using a copper alloy at or about the 60 at % silver eutectic point for the alloy. This will result in a melt temperature of about 780° C., which is considerably lower than a pure copper melt temperature of about 1085° C., and is only about 120° C. above the melt temperature for aluminum and alloys thereof commonly presently used in conductive integrated circuit interconnections. Accordingly, the low-melt temperature of the eutectic alloy presents an opportunity for low temperature reflow after thin film deposition for small via and deep trench-fill applications.

This particular application could have a profound impact on thin film deposition. With the ever shrinking device feature size and integrated circuitry design rules, one of the bottlenecks for thin film deposition is the complete filling of small via and trenches. Pressure or temperature-assisted film deposition has been adopted to leverage the difficulty of small via and trench-fill in aluminum metallization. However, high pressure is not well-compatible with conventional integrated circuitry processes, and therefore has not been very well accepted by the industry. Accordingly, predominantly high temperature processing has been used in most applications. Yet for copper metallization, the temperature-assisted deposition is not expected to be practical due to its high melt temperature. Yet, copper-silver alloys at the preferred composition range between 50 at % and 70 at % silver, and even more preferably at around the eutectic point of 60 at % silver, may provide significant processing advantages in using copper alloys.

In another aspect of the invention, a physical vapor deposition target comprises an alloy of copper and tin, with tin being present in the alloy at from less than 1.0 at % to 0.001 at %, and more preferably at from 0.01 at % to 0.1 at %. An aspect of the invention also contemplates conductive integrated circuitry metal alloy interconnections comprising this alloy. Preferably, such interconnections will have higher electromigration resistance than copper of a purity of greater than 99.999% of the same grain size. Further preferably, such interconnections will have greater thermal stability to grain size retention and crystal orientation retention than copper of a purity of greater than 99.999% of the same grain size. Further preferably, the interconnections will have an electrical resistivity of less than 1.8 microohms.cm. Tin can form uniformly fine precipitates in the microstructure in the form of intermetallic compound precipitates.

A series of copper alloys were prepared using conventional vacuum induction melt and air melt methods. A high purity copper (purity of 99.9998% (5N8)) was used as a reference, as well as the starting material for the copper alloys described above. Different levels of silver and tin were doped into the reference copper to obtain the copper alloys. Chemical analysis was taken from the as-cast samples using glow discharge mass spectroscopy (GDMS). Thermal stability was evaluated using hardness, grain size, and texture (grain orientation) analysis at different temperatures. Electrical resistivity was measured using bulk samples at room temperature.

The detailed results are shown in the tables below, with all ppm values being in weight percent.

| Material | Electrical Resistivity ($\mu\Omega \cdot cm$) |
|---|---|
| Pure Cu (5N8) | 1.70 |
| Cu w/ 16 ppm Sn | 1.71 |

-continued

| Material | Electrical Resistivity ($\mu\Omega \cdot cm$) |
|---|---|
| Cu w/ 530 ppm Sn | 1.69 |
| Cu w/ 135 ppm Ag | 1.82 |
| Cu w/ 145 ppm Ag | 1.75 |
| Cu w/ 385 ppm Ag | 1.75 |

| Material | Recrystallization Temperature (° C.) |
|---|---|
| Pure Cu (5N8) | 150 |
| Cu w/ 350 ppm Sn | 250 |
| Cu w/ 530 ppm Sn | 300 |
| Cu w/ 145 ppm Ag | 350 |
| Cu w/ 385 ppm Ag | 400 |

| Material | Grain Size Retention Temperature (° C.) | Texture Retention Temperature (° C.) |
|---|---|---|
| Pure Cu (5n8) | 350 (grain size 30 $\mu$m) | 150 |
| Cu w/ 530 ppm Sn | >400 (grain size 20 $\mu$m) | 300 |
| Cu w/ 385 ppm Ag | >400 (grain size 20 $\mu$m) | 400 |

The above reduction-to-practice examples show tin and silver-copper alloys having approximately the same electrical resistivity as pure copper. Further, such copper alloys demonstrate improved thermal stability and refined grain structure.

Both silver and tin have negligible solid solubility in copper at room temperature. Accordingly, almost all of the doped silver and tin preferably precipitates out of the copper matrix once the alloy is solidified. A preferred result is a virtually clean copper matrix with a small amount of silver or $CuSn_3$ intermetallic compounds. Preferably, there is little copper lattice distortion in very small amount of precipitates, leaving the electrical resistivity very close to pure copper. This trend should result where the doping element does not form solid solution with copper, and its amount is less than 1 at % silver or tin.

The invention also contemplates use of other copper alloys in physical vapor deposition targets, conductive integrated circuit interconnections, and electroplating anodes. These materials include elements which have low room temperature solid solubility and uniformly distributed fine precipitates in the microstructure, much like silver and tin. One class of elements forms intermetallic compound precipitates in the microstructure. These include Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, and Te. In accordance with an aspect of the invention, physical vapor deposition targets, conductive integrated circuit interconnections, and electroplating anodes are comprised of an alloy of copper and one or more other elements, with the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, and Te. Such copper alloys are expected to have higher electromigration resistance than copper of a purity of greater than 99.999% of the same grain size. Further, such copper alloys are expected to have greater thermal stability to grain size retention and crystal orientation retention than copper of a purity of greater than 99.999% of the same grain size.

Another class of elements forms element precipitates in the microstructure. These include V, Nb, Ta, Cr, Mo, W, Mn, Tc, Re, Fe, Ru, Os, Co, Rh, Ni, Pd, Pt, Au, Tl, and Pb. In accordance with an aspect of the invention, physical vapor deposition targets, conductive integrated circuit interconnections, and electroplating anodes are comprised of an alloy of copper and one or more other elements, with the one or more other elements being present in the alloy at a total concentration from less than 1.0 at % to 0.001 at % and being selected from the group consisting of V, Nb, Ta, Cr, Mo, W, Mn, Tc, Re, Fe, Ru, Os, Co, Rh, Ni, Pd, Pt, Au, Tl, and Pb. Such copper alloys are expected to have higher electromigration resistance than copper of a purity of greater than 99.999% of the same grain size. Further, such copper alloys are expected to have greater thermal stability to grain size retention and crystal orientation retention than copper of a purity of greater than 99.999% of the same grain size.

FIG. 1 diagrammatically depicts a sputtering system comprising a sputtering assembly 20 and a wafer 22 to be sputter deposited upon. Sputtering assembly 20 comprises a main sputtering target 24 adhered to a backing plate 26 by conventional or yet-to-be developed methods. Sputtering assembly 20 also includes an RF sputtering coil 28 received intermediate main target 24 and substrate 22. One or both of main target 24 and RF sputtering coil 28 is fabricated to comprise one or more of the above alloys.

Figure 2:
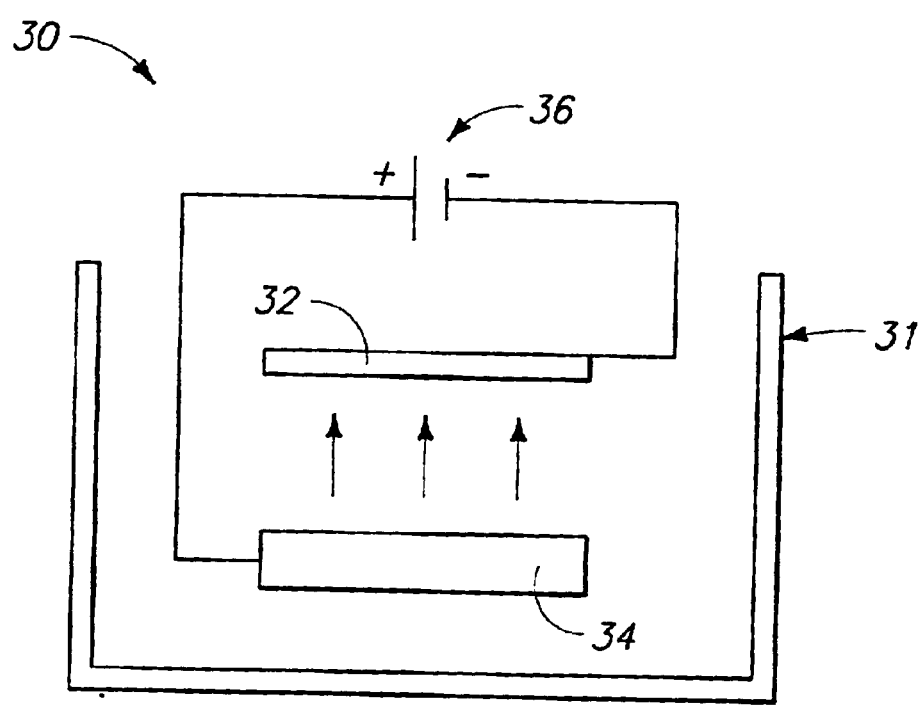
FIG. 2 is a diagrammatic sectional view of an electroplating system incorporating an electroplating anode in accordance with an aspect of the invention.

In one aspect, the invention also contemplates use of one or more of the above alloys as an electroplating anode. FIG. 2 diagrammatically depicts but an exemplary electroplating system 30 comprising a liquid reservoir 31. A substrate 32 to be deposited upon and an electroplating anode 34 are received within a suitable plating solution within reservoir 31 opposite one another. Substrate 32 and anode 34 are electrically interconnected with one another through a suitable power source 36 configured to enable substrate 32 to function as a cathode, and thereby deposit material from electroplating anode 34 onto substrate 32.

Figure 3:
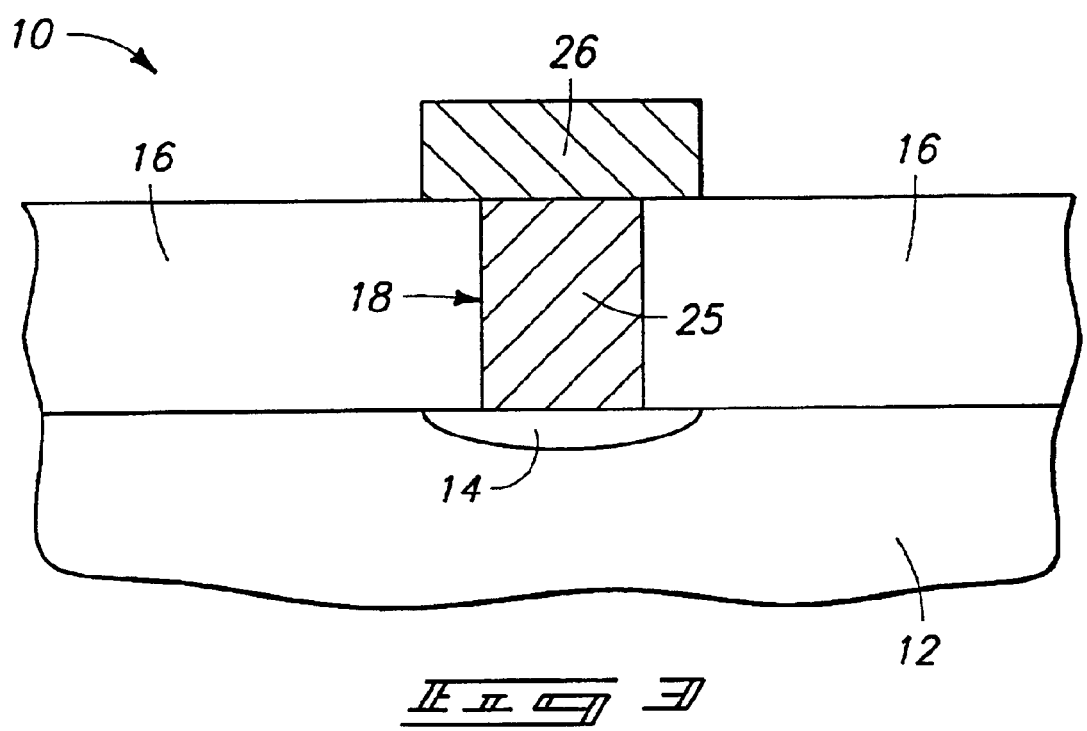
FIG. 3 is a cross-sectional view of a semiconductor wafer fragment comprising integrated circuitry including a conductive metal alloy interconnection in accordance with an aspect of the invention.

FIG. 3 illustrates but an exemplary semiconductor wafer fragment indicated generally with reference numeral 10. Such comprises a bulk semiconductive substrate 12 having an electrically conductive diffusion region 14 formed therein. An electrically insulating layer 16 is formed over substrate 12 and a contact opening 18 has been formed therethrough over diffusion region 14. Such has been plugged with an electrically conductive plugging material 25, which preferably comprises one or more of the alloys as described above. Diffusion barrier or adhesion layers (not shown) might also, of course, be utilized relative to contact opening 18. An electrically conductive line 26 has been deposited and patterned over and in electrical connection with conductive plugging material 25. Interconnect line 26 also preferably comprises one or more of the above-described alloys. Components 26 and 25 constitute exemplary conductive integrated circuit metal alloy interconnections preferably comprising one or more of the alloys described herein. Such might comprise different materials as depicted by the different section lines, or constitute the same material throughout. Other constructions are of course contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A physical vapor deposition target made of a copper alloy consisting of copper and one of more other elements, the one or more other elements being present in the alloy at a total concentration from less than 1.0 at % to 0.001 at % and being selected from the group consisting of Sr, Ba, and Se.

2. The physical vapor deposition target of claim 1 wherein the one or more other elements awe present in the alloy at a total concentration at from 0.005 at % to 0.1 at %.

3. The physical vapor deposition target of claim 1 comprising an RF sputtering coil.

4. The physical vapor deposition target of claim 1 wherein the element comprises Sr.

5. The physical vapor deposition target of claim 1 wherein the element comprises Ba.

6. The physical vapor deposition target of claim 1 wherein the element comprises Se.

7. The physical vapor deposition target of claim 1 wherein the one or more other elements form intermetallic compound precipitates in the alloy microstructure.

8. The physical vapor deposition target of claim 1 whereut the average grain size ma less than or equal to about 20 micrometers.

9. A physical vapor deposition target made of a copper alloy consisting of copper having a purity of 99.9998% and a total concentration of other elements of from less than 1.0 at % to 0.001 at % the other elements being selected from the group consisting of Sr, Ba, Sc and Se, at leat one of Sr, Ba and Se being present.

10. The physical vapor deposition target of claim 9 wherein the copper alloy comprises an average grail size and comprises an electromigration resistance higher than the electromigration resistance of copper having a purity of greater than 99.999% of the same average grain size.

11. The physical vapor deposition target of claim 9 wherein the copper alloy comprises an average grun size and comprises a thermal stability to grain size retention that is higher than the thermal stability to grain size retention of copper having a purity of greater than 99999% of the same average grain size.

12. The physical vapor deposition target of claim 9 comprising three or fewer of the other elements.

* * * * *

UNITED STATES PATENT AND TRADEMARK OFFICE
CERTIFICATE OF CORRECTION

PATENT NO. : 6,758,920 B2
DATED : July 6, 2004
INVENTOR(S) : Nagano et al.

It is certified that error appears in the above-identified patent and that said Letters Patent is hereby corrected as shown below:

Title page,
Item [56], References Cited, U.S. PATENT DOCUMENTS, replace "3,666,686" with -- 3,666,666 --.

Column 2,
Line 35, replace "Ti" with -- Tl --.

Column 8,
Line 4, replace "whereut" with -- wherein --.
Line 5, delete "ma".
Line 19, replace "grun" with -- grain --.

Signed and Sealed this

Eighteenth Day of January, 2005

JON W. DUDAS
*Director of the United States Patent and Trademark Office*